United States Patent [19]

Boyan et al.

[11] Patent Number: 4,466,073
[45] Date of Patent: Aug. 14, 1984

[54] WAFER PREALIGNER USING PULSED VACUUM SPINNERS

[75] Inventors: Gerard E. Boyan, Redding; Enso J. Maleri, Bridgeport, both of Conn.

[73] Assignee: The Perkin Elmer Corporation, Norwalk, Conn.

[21] Appl. No.: 371,402

[22] Filed: Apr. 26, 1982

[51] Int. Cl.³ .................. B65G 47/24; B65G 51/02
[52] U.S. Cl. .................. 364/559; 364/489; 318/640; 356/400; 358/101; 406/87
[58] Field of Search ............... 364/167, 489, 490, 491, 364/559; 318/640; 358/101; 356/400; 406/87

[56] References Cited

U.S. PATENT DOCUMENTS

| | | | |
|---|---|---|---|
| 3,930,684 | 1/1976 | Lasch et al. | 406/87 X |
| 4,242,038 | 12/1980 | Santini et al. | 406/87 X |
| 4,301,470 | 11/1981 | Pagany | 358/101 |
| 4,328,553 | 5/1982 | Fredriksen et al. | 364/167 X |
| 4,362,385 | 12/1982 | Lobach | 318/640 X |

Primary Examiner—Jerry Smith
Assistant Examiner—Allen MacDonald
Attorney, Agent, or Firm—E. T. Grimes; T. P. Murphy

[57] ABSTRACT

Wafer alignment apparatus includes an aligner platform having defined thereon X and Y axes and a desired rotational orientation for a wafer. A first vacuum spinner is supported for rotation in the platform about the intersection of the X and Y axes and second and third spinners are provided displaced from the intersection of the axes. Two edge sensors, for sensing the desired wafer edge location at two points separated from each other, and edge or notch sensors for sensing rotational alignment of said wafer provide inputs to logic means which provide outputs to the vacuum spinners for carrying out a series of individual rotations to align the wafer.

8 Claims, 6 Drawing Figures

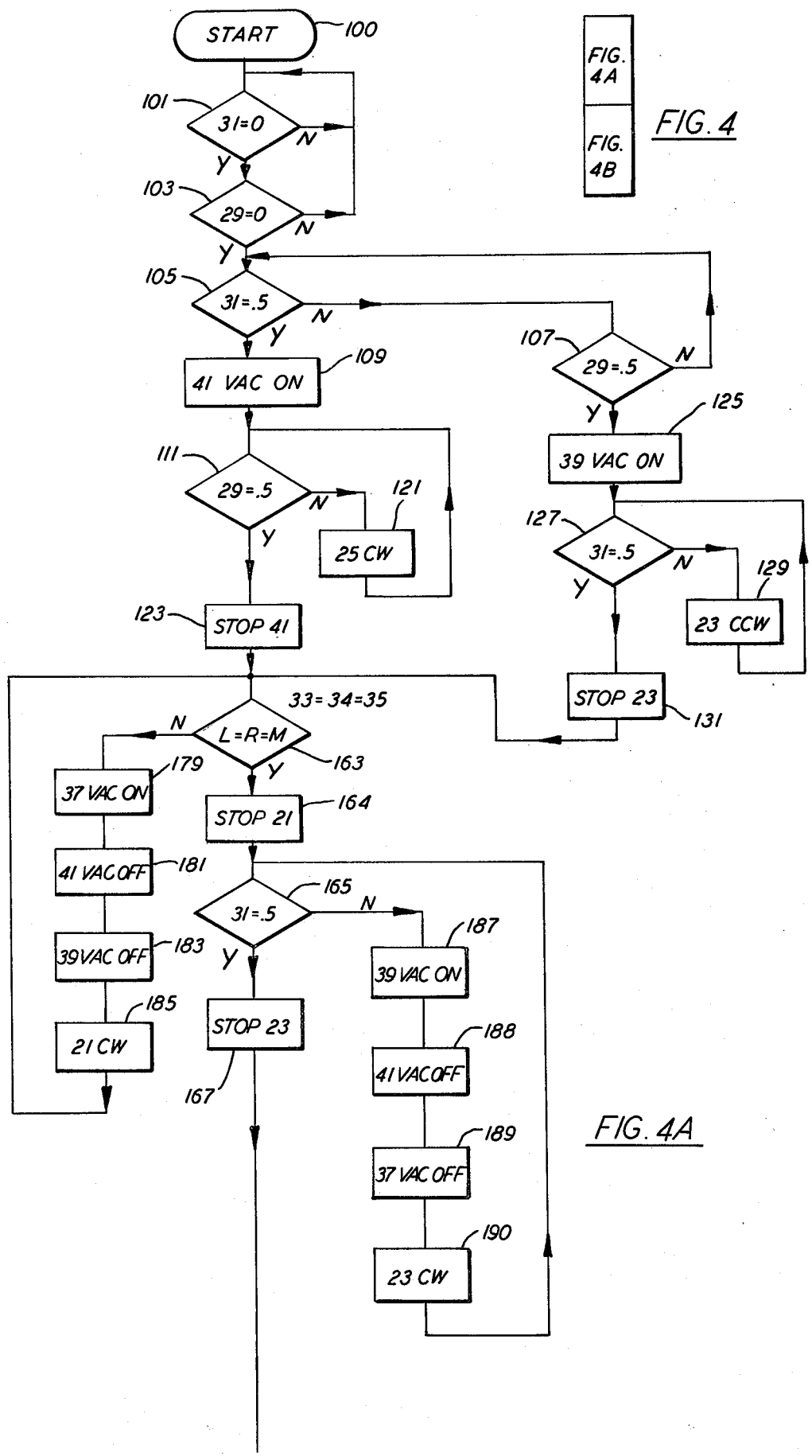

WAFER PREALIGNER USING PULSED VACUUM SPINNERS

BACKGROUND OF THE INVENTION

The invention relates to micro-circuits, in general, and more particularly to an improved wafer prealignment system for use in the processing of wafers of silicon and the like to make micro-circuits.

As it is well known by those skilled in the art, for the making of micro-circuits, a wafer of silicon, which may be as large as 120 mm in diameter, for example, must be processed through a number of steps. Included among these steps are steps of dry processing (e.g., an isotopic etching) and steps of fine alignment for exposure purposes. In the case of dry processing, absolute alignment accuracy is not essential. In the case of exposing the wafer, accuracy beyond that obtainable with a prealignment system is necessary. For this purpose, the machines which are used for exposing wafers generally have fine alignment systems. However, for the fine alignment systems to be effective, a prealignment within a certain tolerance, for example, within plus or minus 0.25 mm is necessary to avoid an essentially random search in the fine alignment system. The smaller the prealignment error the better. In other words, with better prealignment, a simpler and faster fine alignment system becomes possible.

Various prior art prealignment systems have been developed. Typically, these handle the wafers by the edges. Handling by the edges is undersirable since it can result in contamination or breakage. Systems which do not touch the edges have been developed. However, they cannot provide the necessary speed, accuracy, and reliability of alignment.

Thus, it is the object of the present invention to provide an improved prealigner and a method of carrying out prealignment which quickly and effectively gives the required accuracy for dry processing and for prealignment in a device where further fine alignment takes place, which does not require handling the edges of the wafer.

SUMMARY OF THE INVENTION

The present invention accomplishes this object by the use of vacuum spinners. Each vacuum spinner utilized is capable of grabbing the back of the wafer and rotating. The vacuum spinners include an on-axis and at least one off-axis spinner. The spinners are operatively coupled to the wafer in sequence under the control of a logic system which may be implemented in a hard-wired form or with a micro-processor or other computer. Inputs to the logic system for optical or pneumatic sensors indicate the edge positions and control the sequence of pulsing, and the direction of rotation of the spinners.

In the preferred embodiment, a center vacuum spinner, which is on-axis, and left and right vacuum spinners are utilized. Associated with the center of each of the left and right spinners is an optical or pneumatic sensor. In addition, three sensors in a row are provided to detect a flat or notch in the wafer to insure proper rotational alignment. In the illustrated embodiment, control is carried out by means of a programmed micro-processor. The system illustrated carries out sufficient interaction to align the wafer for dry processing. If a more accurate alignment is required, additional iterations can be carried out.

BRIEF DESCRIPTION OF THE DRAWINGS

FIG. 4 shows how FIGS. 4A and 4B are to be combined.

FIGS. 4A and 4B are a flow diagram for the microprocessor of FIG. 1.

DETAILED DESCRIPTION OF THE INVENTION

Figure 1:
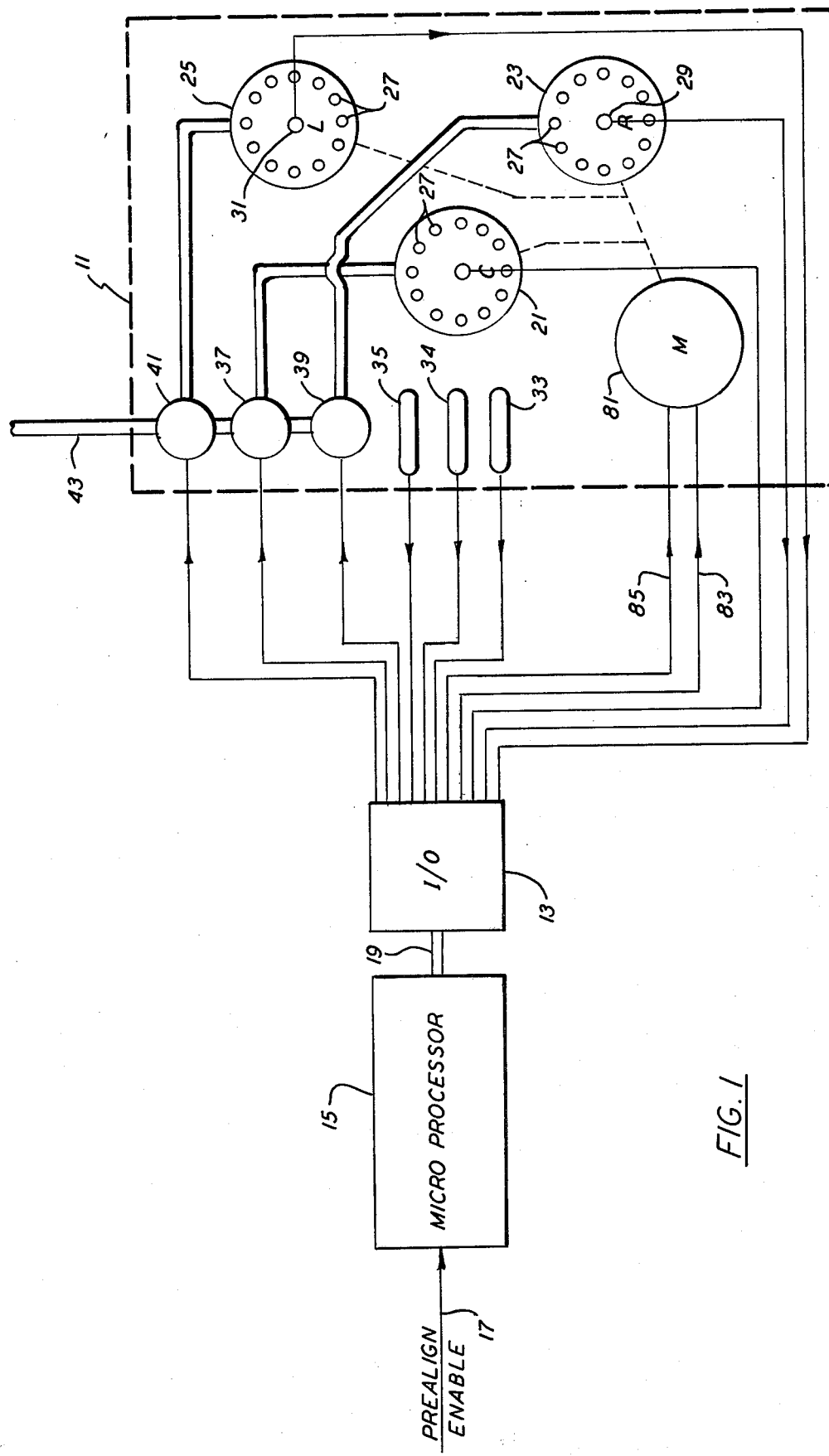
FIG. 1 is a block diagram of the system of the present invention.

FIG. 1 is a block diagram of the prealignment system of the present invention. The prealigner itself is indicated by block 11. The prealigner receives inputs from and provides outputs to an I/O port 13 associated with a micro-processor 15. Micro-processor 15 receives an input on a line 17 from the system with which it is used, enabling prealignment. Microprocessor 15 is coupled to I/O port 13 over a bus 19 in conventional fashion. Within the prealigner are three vacuum spinners, a center vacuum spinner 21, a right vacuum spinner 23 and a left vacuum spinner 25. Each of these contains a plurality of outlets 27 which can be coupled to a vacuum source to grab an overlying wafer in a manner to be seen more fully below. Associated with the right spinner 23 is a sensor 29 and with the left spinner a sensor 31. Outputs from these sensors are coupled into the I/O port 13. In addition, left, middle and right optical flat detector 33-35 provide outputs to the I/O port 13. Based on these outpts, in accordance with a program to be described more fully below, the I/O port 13 provides outputs to vacuum line solenoid valves 37, 39 and 41 associated; respectively, with the spinners 21, 23 and 25. Each of the solenoid valves 37, 39 and 41 receives an input from a vacuum source on line 43 and, when operated by its associated control line, couples that vacuum to its associated spinner.

Figure 2:
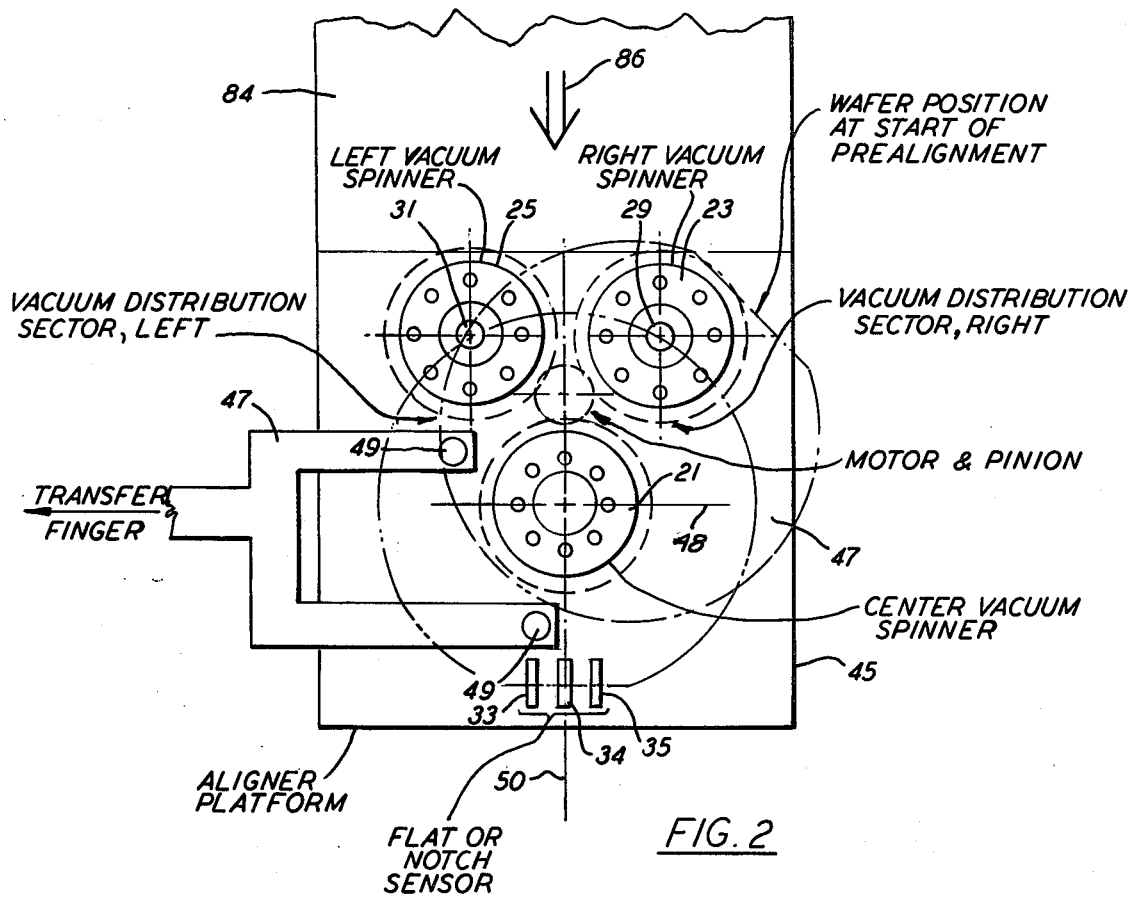
FIG. 2 is a plan view of the arrangement of the vacuum spinners of the present invention showing the location of the spinners and the sensors.

The operation of the vacuum spinners can better be seen from FIG. 2, which is a schematic plan view of the arrangement of the spinners on an aligner platform 45. Each of the spinners 21, 23 and 25 is supported for rotation in an appropriate bore in the aligner platform 45. Also provided in the aligner platform 45 is a suitable recess for transfer fingers 47 having on at their end vacuum ports 49 for grabbing the wafer once it is prealigned to the transfer it, in the prealigned condition, to a location where additional alignment or dry processing will take place. Between the transfer fingers 47 are the flat or notch sensors 33-35. Shown on the drawing is an X axis 48 and a Y axis 50. The spinner 21 is centered at the intersection of the axes 48 and 50. Sensor 34 lies on the X axis 50, sensor 33 to the left thereof and sensor 35 to the right thereof.

Figure 3:
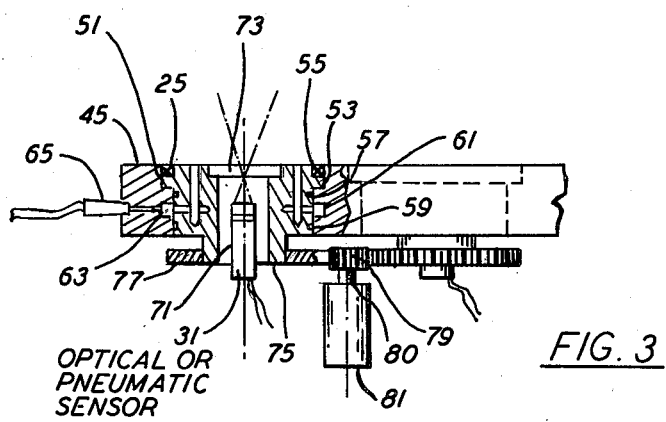
FIG. 3 is a cross section through a vacuum spinner.

As can be seen from the cross section of FIG. 3, which is taken through the left vacuum spinner 25, appropriate bores are formed in the aligner platform 45 for the spinners. A smaller bore extends completely through the aligner platform with a larger bore near the top surface forming a ledge 51 on which a flange 53 of the spinner can rest. In the illustrated embodiment, a bearing 55 is provided between the spinner 25 and the bore. Below the flange 53 the vacuum spinners are essentially cylindrical and contain therein a pair of circumferential grooves 57 and 59 containing O-ring seals.

These seal against the bore in the alignment platform above and below a circumferential channel 61 which is coupled through a channel (not shown) to a vacuum fitting 65 coupled to the associated solenoid valve, i.e., the solenoid valve 41 of FIG. 1. Plug 63 in the channel 61 restricts the vacuum to those portions of the spinner that are under the wafer being aligned. The spinner contains a central bore 71 in which a sensor is inserted, in this case sensor 31. The sensor may be a LED-photodetector type sensor, the photodetector detecting the reflection of the LED off the bottom of the wafer or detecting light from a source above that is blocked by the wafer. A transparent cover 73 is provided over the sensor 31.

The inner end of the spinner has a portion 75 of reduced diameter on which gear 77 is disposed. Gear 77 engages with a gear 79 on the shaft 80 of a motor 81. Referring back to FIG. 1, motor 81 is driven by an output from the I/O port 13 on line 85 with its direction controlled by an output on line 83.

In operation, when prealignment is to take place, the wafer is transferred on air track 84, the end of which forms the platform 45, in conventional fashion, in the direction of arrow 86. Air through a plurality of holes (not shown) supports and propels the wafer. Once the wafer reaches its approximate proper position, the motor 81 will be driven, driving the gears associated with each of the spinners in either a clockwise or counterclockwise direction depending on whether an output is provided on line 83 or not. Which of the spinners is activated to rotate the wafer will depend upon the operation of the solenoid valves 37, 39 and 41. A typical position of a wafer when first placed on the platform is shown in dotted lines on FIG. 2. A typical sequence of operations which is used to align the wafer is as follows: The right vacuum spinner rotates, for example, counterclockwise until the edge is sensed at the left vacuum spinner 25 by its sensor 31. Then, the valve for the left vacuum spinner is opened and that of the right vacuum spinner closed and the left vacuum spinner rotates clockwise until sensor 29 senses the edge. It can be seen that now the wafer is aligned generally with respect to the X and Y axes 47 and 49 but it is improperly rotated, i.e., the flat is about 90° away from where it should be. This will cause the flat sensors to be other than equally covered rather than equally covered as they should be. Operation of the valve associated with the center spinner 21, and a rotation thereof, either clockwise or counterclockwise until the desired condition with respect to sensors 33, 34 and 35 is detected, thus, takes place.

Figure 4B:
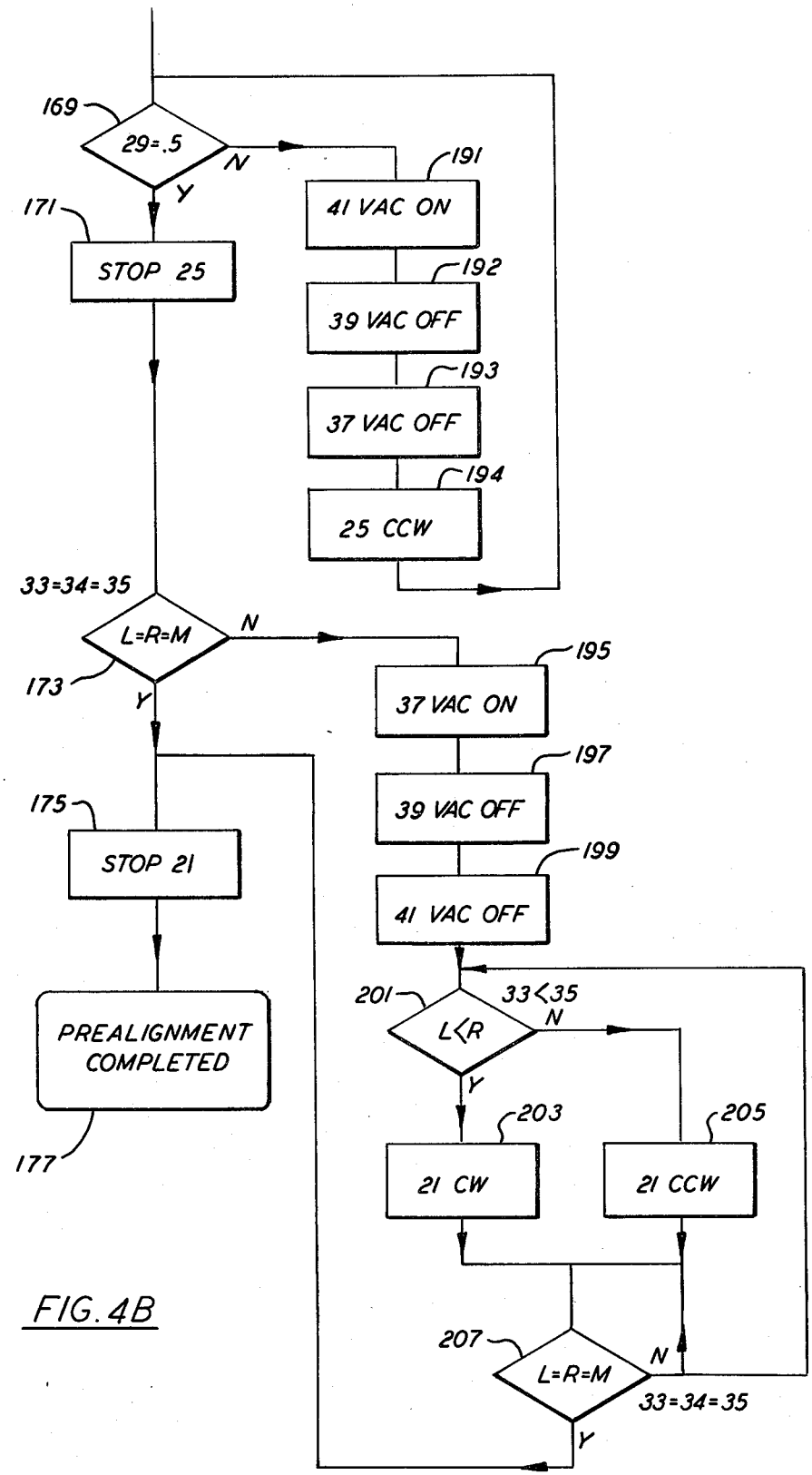

FIG. 4 is a flow diagram for the program which will be stored in the micro-processor of FIG. 1 to carry out alignment. In this program the designation "O" with respect to apertures means that the aperture is completely covered by the wafer. The designation 1 means the apertures are not covered by the wafer. Half covered is indicated by 0.5. When the wafer is first moved by the air track on the aligner platform, upon entering the program, following start 100, a first decision is made whether or not sensor 31 associated with spinner 25 is covered. If it is not, the program exits to decision block 103 where it is determined whether or not sensor 29 associated with spinner 23 is fully covered. If it is also not covered, the program loops back to decison block 101. As the wafer moves from above in the direction of arrow 86 of FIG. 2, it will first cover both sensors completely. When both the sensor 31 and the sensor 29 become covered, block 103 is exited to decision block 105 to see if sensor 31 is half covered. If not, then it exited to block 107 to check to see if sensor 29 is half covered. If it is not, it loops back to block 105. As the wafer moves in the direction of arrow 86 over sensor 29 and sensor 31, the program continues looping back and checking to see if sensor 29 or sensor 31 become half covered. When one does become half covered, assume it is sensor 31, decision block 105 is exited to block 109 which causes the vacuum to be applied by turning on solenoid valve 41. Decision block 111 is entered to see of sensor 29 is half covered. If not, as indicated by block 121, spinner 25 is rotated in the clockwise direction. Again, the program loops around continuing to check and once the condition is met exits to block 123 which stops the spinner 25.

Returing now to decision block 107, if sensor 29, is first half uncovered, in block 125, vacuum for solenoid 39 associated with spinner 23 is turned on. Decision block 127 is entered where a check is made to see if sensor 31 is half covered. If not, the motor is driven so as to drive spinner 23 counterclockwise as indicated by block 129. Again, continual checks are made and, when the condition is met, decision block 127 is exited and spinner 23 stopped as indicated by block 131.

Upon exiting block 123 or block 131, the condition of the wafer is such that its edges are at the center of the indicators 29 and 31. However, in the example shown in FIG. 2 the flat would be rotated approximately 90° from its proper position. The situation would then be that sensors 33, 34 and 35 would be partially but unequally covered because of the radius of the wafer. A decision block 163 is now entered to see if all three are equal. In the unusual case that the flat was properly aligned, the answer would be "Yes." Exiting from block 163 the center spinner 21 is stopped by stopping motor rotation. Next the decision block 165 is entered where half coverage of sensor 31 is checked. In this rare situation discussed, the answer from here would be "Yes" and a block 167 is entered which directs the stoppage of spinner 23 by stopping the motor. This is followed by a decision block 169 where half coverage of sensor 29 is checked. Again in this example, it is half covered and an exit to a block 171 which stops spinner 25 results. From here, one enters the decision block 173 where the equality of sensors 33, 34 and 35 is again checked. Again, this being "Yes", the program enters a block 175 which directs stopping spinner 21 followed by the exit from the program in block 177, prealignment having been complete.

The more typical situation is one where the flat is not aligned after the first alignment of the edges. Thus, the answer in block 163 will be "No.". This will cause the vacuum to be turned on by turning on the solenoid 37 as indicated in block 179, vacuum to the other two spinners to be turned off, as indicated in blocks 181 and 183, and rotation of the center spinner 21 clockwise as indicated by the block 185. Rotation continues until the condition set in block 163 is met. The program then exits to block 164 described above and into block 165. Now, quite possibly, because of the rotation, the edges are no longer properly aligned. Thus, when a check is made to see if sensor 31 is half covered the answer is "No." Solenoid 39 is energized to supply the vacuum as indicated by block 187, vacuum turned off to the other two spinners as indicated by blocks 188 and 189 and rotation on the spinner 23 clockwise initiated as indicated by block 190. When a "Yes" answer is obtained from block 165 it is exited through block 167 and decision block 169 entered. Again, assuming that the sensor 29 is not half covered, one exits from this block into a block 191 which indicates that the vacuum should be turned on by turning on the solenoid valve 41. Again, vacuum is turned off to the other two spinners as indicated by blocks 192 and 193 followed by a counterclockwise rotation of spinner 25 as indicated by block 194. Once this condition is met, block 169 is exited through block 171 and block 173 entered. Because of the adjustment of the edges, the condition set by block 173, which was the condition of block 163 may no longer be true. If it is not, then, as indicated by block 195, solenoid 37 is closed to supply vacuum to spinner 21 and vacuum turned off to the other two spinners as indicated by blocks 197 and 199. A check is then made in decision block 201 to see whether the left or the right sensor, i.e., sensor 33 or 35 is greater. If more of sensor 35 is uncovered then a clockwise rotation is necessary. Conversely, if more of sensor 33 is uncovered counterclockwise rotation is necessary. This is indicated by the respective block 203 and 205 the outputs of which join at the input to decision block 207 which again checks for the equality of the three. As long as the answer is "No" from this block, it loops back to the input of block 201 and rotations continue until the desired condition is met. Then block 207 is exited to block 175 explained above, the motor stopped and prealignment completed. It should be evident that this additional step of aligning the flat could again throw off the alignment of the edges. Thus, it would be possible upon exiting block 207 to go back to block 165 and go through another iteration. Prior to carrying out rotation of block 190 or of block 194 for this iteration it is desirable to check to see whether or not the respective sensor is more than half covered of less than half covered. If such a check is made then the direction of rotation can be selected to provide the shortest distance of rotation. As many iterations as necessary may be carried out to give the desired degree of alignment accuracy.

The disclosed arrangement of spinners and sensors has been found to be particularly advantageous and efficient. However, the invention can be implemented with other arrangements of on-axis and off-axis spinners along with other sensor arrangements and logic schemes. In general, at least two off-axis spinners will be required along with one on-axis spinner. The off-axis spinners along with the edge sensors are utilized to get the wafer properly aligned with respect to the X and Y axes. The center spinner is used basically to then rotate the wafer so that its flat or notch is properly aligned.

What is claimed is:

1. An apparatus for prealinging a circular wafer comprising;
   (a) an aligner platform having defined thereon X and Y axes and a standardized reference X, Y and rotational orientation for a wafer; said wafer having a flat or notch formed in the periphery thereof,
   (b) a first vacuum spinner, first means supporting said vacuum spinner for rotation in said platform about the intersection of the X and Y axes;
   (c) at least second and third spinners, second means supporting said second and third spinners for rotation in said platform, displaced from said intersection of said axes;
   (d) at least two edge sensors for sensing the required wafer edge location at two points separated from each other;
   (e) at least one flat or notched sensor for sensing rotational alignment of said wafer; and
   (f) logic means for receiving inputs from said sensors and providing outputs to said vacuum spinners for carrying out a series of individual rotations to align said wafer.

2. Apparatus according to claim 1, wherein second means rotate said second and third off-axis vacuum spinners about points located on the peripherey of the wafer when in the required position and wherein said first and second edge sensors are disposed at the centers of said second and third vacuum spinners.

3. Apparatus according to claim 2, wherein said second and third vacuum spinners are equally spaced from one axis of said alignment platform.

4. Apparatus according to claim 3, wherein said flat or notch sensors comprise three sensors disposed in a line corresponding to a line of said flat or notch, one sensor on an axis to which said notch or flat is to be perpendicular and the other two sensors equally spaced therefrom.

5. Apparatus according to claim 1 or 4, wherein said logic means comprise a programmed micro-processor and associated input output ports.

6. A method of prealigning a wafer on a prealignment platform having a central axis comprising:
   (a) linearly moving said wafer along a central axis of said platform,
   (b) sensing said wafer at a pair of positions equally spaced from said central axis,
   (c) spinning said wafer in a first direction until the edge of said wafer is detected at one of said positions,
   (d) spinning said wafer in a second direction until the edge of said wafer is detected at the other of said positions,
   (e) stopping said wafer from spinning when the edge of said wafer is sensed simultaneously at said pair of positions.

7. A method according to claim 6 further including;
rotating said wafer after the edge has been sensed simultaneously at said pair of positions,
sensing a notch or flat on said wafer,
stopping the rotation of said wafer when said notch of flat has been sensed.

8. A method according to claim 7 further including;
performing the steps of claim 6 after the rotation of said wafer is stopped as result of a flat or notch.

* * * * *

UNITED STATES PATENT AND TRADEMARK OFFICE
CERTIFICATE OF CORRECTION

PATENT NO. : 4,466,073
DATED : Aug. 14, 1984
INVENTOR(S) : Gerard E. Boyan & Enso J. Maleri It is certified that error appears in the above-identified patent and that said Letters Patent are hereby corrected as shown below:

Column 6, line 1, after "supporting" said, insert --first--,

Column 6, line 54, change second occurrence of "of" to --or--.

Signed and Sealed this

Eighth Day of January 1985

[SEAL]

Attest:

GERALD J. MOSSINGHOFF

*Attesting Officer*

*Commissioner of Patents and Trademarks*